(12) United States Patent
Jin et al.

(10) Patent No.: US 7,671,414 B2
(45) Date of Patent: Mar. 2, 2010

(54) SEMICONDUCTOR ON INSULATOR APPARATUS

(75) Inventors: Been-Yih Jin, Lake Oswego, OR (US); Reza Arghavani, Aloha, OR (US); Robert Chau, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 12/195,323

(22) Filed: Aug. 20, 2008

(65) Prior Publication Data

US 2008/0303116 A1    Dec. 11, 2008

Related U.S. Application Data

(63) Continuation of application No. 10/222,173, filed on Aug. 16, 2002, now Pat. No. 7,427,538.

(51) Int. Cl.
*H01L 23/62* (2006.01)
(52) U.S. Cl. .......................... 257/347; 438/149; 438/479
(58) Field of Classification Search ................. 257/347; 438/149, 479, 517
See application file for complete search history.

(56) References Cited

U.S. PATENT DOCUMENTS

| | | | |
|---|---|---|---|
| 5,206,528 A | 4/1993 | Nashimoto | |
| 5,232,862 A | 8/1993 | Heremans et al. | |
| 5,882,987 A | 3/1999 | Srikrishnan | |
| 6,287,710 B1 | 9/2001 | McKee et al. | |
| 6,586,981 B2 | 7/2003 | Shibuya | |
| 6,589,856 B2 | 7/2003 | Curless | |
| 6,652,989 B2 | 11/2003 | McKee et al. | |
| 2001/0049029 A1 | 12/2001 | McKee et al. | |
| 2002/0168826 A1 | 11/2002 | Jin et al. | |
| 2003/0036213 A1 | 2/2003 | Brophy | |
| 2003/0036224 A1 | 2/2003 | Gorrell et al. | |
| 2003/0057423 A1 | 3/2003 | Shimoda et al. | |
| 2003/0062553 A1 | 4/2003 | Ramesh et al. | |
| 2003/0116849 A1 | 6/2003 | Suzuki et al. | |
| 2003/0184933 A1 | 10/2003 | Lin et al. | |

FOREIGN PATENT DOCUMENTS

JP          01143235          6/1989

*Primary Examiner*—Fernando L Toledo
(74) *Attorney, Agent, or Firm*—Blakely, Sokoloff, Taylor & Zafman LLP

(57) ABSTRACT

A method and apparatus for producing a relatively thin, relatively uniform semiconductor layer which has improved carrier mobility. In an embodiment, a lattice-matched insulator layer is formed on a semiconductor substrate, and a lattice-matched semiconductor layer is formed on the insulator layer to form a relatively thin, relatively uniform semiconductor on insulator apparatus. In embodiments of the method and apparatus, energy band characteristics may be used to facilitate the extraction of the well-region minority carriers.

21 Claims, 5 Drawing Sheets

SEMICONDUCTOR ON INSULATOR APPARATUS

This application is a continuation of U.S. patent application Ser. No. 10/222,173, filed Aug. 16, 2002, now U.S. Pat. No. 7,427,538 entitled SEMICONDUCTOR ON INSULATOR APPARATUS AND METHOD issued as U.S. Pat. No. 7,427,538 on Sep. 23, 2008.

FIELD

Integrated circuits, and, more specifically, semiconductor on insulator structures and methods of fabrication.

BACKGROUND

Transistors and other devices are connected together to form circuits, such as very large scale integrated circuits, ultra large scale integrated circuits, memory, and other types of circuits. When the size of transistors is reduced and device compaction is increased, problems may arise concerning parasitic capacitance, off state leakage, power consumption, and other characteristics of the device. Silicon on insulator (SOI) structures have been proposed in an attempt to overcome some of these problems. However, SOI structures have a high rate of defects, as it is difficult to produce thin, uniform semiconductor layers in fabrication. Defect problems in SOI structures include defects within a single wafer (e.g., the thickness of the wafer differs at various points on the wafer) and defects from wafer to wafer (e.g., an inconsistent mean Si layer thickness among SOI wafers).

Semiconductor devices include separate p-type and n-type regions. In each region, current conducts by majority carriers of a first conductive type. Minority carriers in the same region, which carry a charge of a conductive type that is opposite of the first conductive type, have a thermal equilibrium concentration that is much lower than that of majority carriers. In a p-type region, holes are majority carriers. In a n-type region, electrons are majority carriers. When a p-type region meets with a n-type region to form a pn junction, a depletion region is formed with a built in potential barrier that prevents the majority carrier of each side from crossing the pn junction. With a reverse bias applied to the two ends of the p and n regions, the potential barrier is further raised to prevent current flow via majority carriers. Minority carriers in each side of the pn junction can move across the junction freely and constitute reverse leakage currents, as they carry charges of a conductive type that is opposite of the first conductive type. Reverse leakage current is more pronounced in a narrow band gap semiconductor, because for the same majority carrier concentration, a narrow band gap semiconductor has a greater minority carrier concentration, and, hence a higher reverse leakage current. The pn junctions exist between the source/substrate regions and the drain/substrate regions (e.g., horizontally orientated) and between the source/channel, drain/channel regions (e.g., vertically orientated). By using a SOI structure, there are no source/substrate or drain/substrate regions, and the reverse leakage across the horizontal pn junction is eliminated. However, the source to channel, and the drain to channel leakage due to minority carriers crossing the vertical junction still exists, and, this channel leakage problem is worse for a narrower band gap semiconductor (e.g., in some embodiments, less than 1.1 eV) semiconductor.

As stated above, as devices are made smaller and smaller, channel length is generally reduced. Reductions in the channel length generally result in increased device speed, as gate delay typically decreases. However, a number of negative side effects may arise when channel length is reduced. Such negative side effects may include, among others, increased off-state leakage current due the threshold voltage roll-off (e.g., short channel effects).

Another way of increasing device speed is to use higher carrier mobility semiconductor materials to form the channel. Carrier mobility is generally a measure of the velocity at which charge carrier flows in a semiconductor under an external unit electric field. In a transistor device, carrier mobility is a measure of the velocity at which carriers (e.g., electrons and holes) flow through or across the device channel in the inversion layer. For example, higher carrier mobility has been found in narrow band gap materials that include Germanium (Ge). Germanium (Ge) has bulk electron and hole mobility of 3900 $cm^2$/Vsec and 1900 $cm^2$/Vsec, respectively, which are much higher that that of bulk electron and hole mobility of Silicon (Si), which are 1500 $cm^2$/Vsec and 450 $cm^2$/Vsec, respectively.

The band gap associated with a semiconductor material is generally based on the difference between the conduction band edge and the valence band edge. In general, a higher mobility semiconductor has narrower band gap. In Germanium, the band gap is approximately 0.67 eV, which is relatively small compared to that of Silicon (Si), which is approximately 1.1 eV.

BRIEF DESCRIPTION OF THE DRAWINGS

The claimed subject matter is illustrated by way of example and not limitation in the figures and accompanying drawings, in which references indicate similar elements, and in which:

DETAILED DESCRIPTION

A SOI apparatus and its method of fabrication are described. Exemplary embodiments are described with reference to specific configurations. Those of ordinary skill in the art will appreciate that various changes and modifications may be made while remaining within the scope of that appended claims. Additionally, a number of well known elements, devices, components, circuits, process steps and the like may not be set forth in detail in order to avoid obscuring the claimed subject matter.

Figure 1:
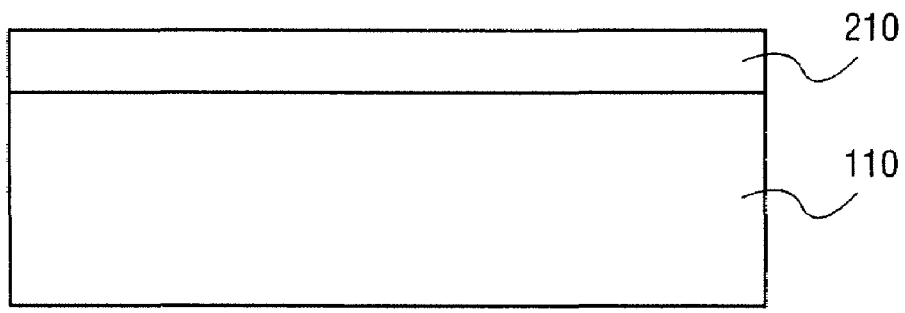
FIG. 1 is an illustration of a cross-sectional view of an embodiment of a semiconductor substrate with an insulator layer formed thereon.

FIG. 1 is a cross-sectional illustration of an embodiment of semiconductor substrate 110. Insulator layer 210 is formed on semiconductor substrate 110. In one embodiment, insulator layer 210 may be formed on semiconductor substrate 110 by an epitaxial growth process, such as molecular beam epitaxy (MBE), metal organic chemical vapor deposition, atomic layer deposition/growth, or by other methods practiced in the art. Epitaxial growth allows for unit by unit growth of the layer, thereby providing a high degree of accuracy in growing the layer to a particular thickness. In an embodiment, semiconductor substrate 110 may function as a base layer to grow other layers, such as, for example, an insulator layer.

In an embodiment, insulator layer 210 includes a material that is lattice matched to a material found in semiconductor substrate 110. Lattice refers to the arrangement of atoms in three-dimensional periodic array of a crystal. If the in-plane atomic distance of two crystal planes of two different materials are substantially close to one another, the materials may be considered lattice matched. For example, the in-plane atomic distance of Germanium (Ge) in a (200) plane is 4.0 Å, and the atomic distance of barium titanate ($BaTiO_3$) in a (100) plane is also 4.0 Å. As such, Germanium (Ge) in a (200) plane may be considered lattice matched to barium titanate ($BaTiO_3$) in a (100) plane. The above-mentioned materials are representative examples of lattice matched materials, and are not to be considered as limiting the scope of the subject matter disclosed herein in regard to the selection of materials. Those skilled in the art will recognize that other materials may be considered lattice matched, and also fall within the scope of the subject matter disclosed herein. For example, strontium titanate ($SrTiO_3$) and silicon (Si) may be used as lattice matched materials.

Insulator layer 210, in one embodiment, may be a crystalline dielectric and may have a high dielectric constant (e.g., high K) such as a dielectric constant on the order of, for example, 7.5 or greater, in one embodiment. Additionally, the characteristics of insulator layer 210, as well as the characteristics of the device as a whole, may be selected so as to match the band edges to those of the semiconductor 110. For example, as discussed below, the characteristics of insulator layer 210 may work to facilitate the extraction of minority carriers. Insulator layer 210 may also serve as a base layer for growing a semiconductor layer above it.

In an embodiment, a suitable high k dielectric will have a large enough band gap to serve as an insulator between the gate and the substrate channel regions, and will have a higher dielectric constant (e.g., greater than 7.5) to provide equivalence gate oxide capacitance at a thicker physical gate oxide thickness. The thicker physical thickness (e.g., greater than 10 Å, in an embodiment) is required to avoid quantum mechanical tunneling of electrons through the ultra thin gate oxide, and to reduce the gate oxide defects.

Figure 2:
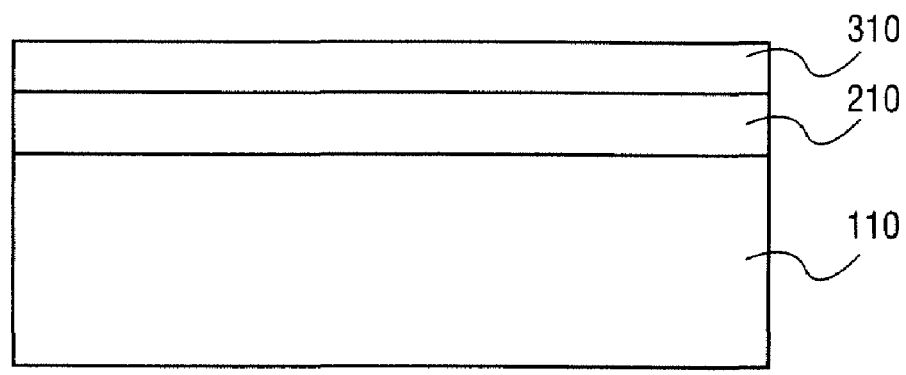
FIG. 2 is an illustration of a cross-sectional view of an embodiment of the structure of FIG. 1 with a semiconductor layer formed thereon.

FIG. 2 is a cross-section illustration of an embodiment of the structure of FIG. 1, with semiconductor layer 310 formed thereon. In one embodiment, at least a portion of semiconductor layer 310 is lattice matched to at least a portion of insulator layer 210. For example, insulator layer 210 may include, barium titanate ($BaTiO_3$) having a (100) plane, and semiconductor layer 310 may include germanium (Ge) having a (200) plane, as these two materials are lattice matched. In an embodiment, insulator layer 210 serves as a base layer and allows semiconductor layer 310 to be formed by epitaxial growth as a layer that may be characterized as being relatively thin, having improved uniformity, being a single-crystal layer, and as having a lower degree of defects or being defect-free.

Semiconductor layer 310 may be made of various materials. Representatively, a material used to form semiconductor layer 310 and a material used to form insulator layer 210 are lattice matched. Semiconductor layer 310 may be epitaxially grown on insulator layer 210 by various methods, including atomic layer epitaxy, molecular beam epitaxy, metal organic chemical vapor deposition, atomic layer chemical deposition, or other methods. Using such methods, semiconductor layer 310 may be uniformly formed. Additionally, the thickness of semiconductor layer 310 may be controlled. In an embodiment, the thickness of semiconductor layer 310 may be controlled to a thickness ranging from approximately 10 Å to 3000 Å. More particularly, in an embodiment, semiconductor layer 310 may be formed with a thickness on the order of 10-30 Å or less. If such growth methods are not used, and semiconductor layer 310 is bonded to semiconductor substrate 110 according to the prior art methods, it may be difficult to make uniform semiconductor layer 310 with a thickness of less than 2000 Å. Moreover, it may be difficult to control the thickness of semiconductor layer 310, and semiconductor layer 310 will not have a uniform thickness. Additionally, in regard to certain materials, it is difficult to obtain wafers of certain sizes, and, therefore, it would be difficult to obtain a wafer (seed substrate) of suitable size to bond to the insulator layer By growing relatively thin semiconductor layer 310 on insulator layer 210, it may not be necessary to thin down, polish or etch back semiconductor layer 310. When thinning down is performed, it is generally difficult to control the thickness of a semiconductor layer to an acceptable degree. Accordingly, having to thin down a device layer by conventional techniques (e.g., polish, etch) might introduce defects into devices fabricated, such as non-uniformity of thickness of a layer within a single wafer on a single device, or from wafer to wafer among separate devices.

In an embodiment, semiconductor layer 310 may undergo processes such as polishing, cleaning, rinsing and/or annealing. Those skilled in the art will recognize that polishing, cleaning, rinsing and/or annealing, if performed, may be performed in various different manners and sequences, which may include all of these processes, may omit certain of these processes, and may also include other processes practiced in the art. Additionally, in an embodiment, semiconductor layer 310 may be used as a base layer to grow further layers.

As stated above, in an embodiment, semiconductor layer 310 includes a material that is lattice matched to a different material found in insulator layer 210. In an embodiment, the lattice-matched material found in semiconductor layer 310 is also found in semiconductor substrate 110. However, in an embodiment, semiconductor substrate 110, insulator layer 210 and semiconductor layer 310 may each include different types of material that are lattice matched. Additionally, in an embodiment, at least a portion of semiconductor layer 310 and at least a portion of insulator layer 210 are lattice matched, but semiconductor substrate 110 and insulator layer 210 may or may not be lattice matched.

Those skilled in the art will recognize that the principles stated above may be used to form an apparatus having multiple semiconductor layers. For example, on top of semiconductor layer 310, a second insulator layer may be formed, and another semiconductor layer may be formed on top of the second insulator layer. As such, the disclosed method can be used to form an apparatus having any number of relatively thin, relatively uniform semiconductor layers.

Figure 3:
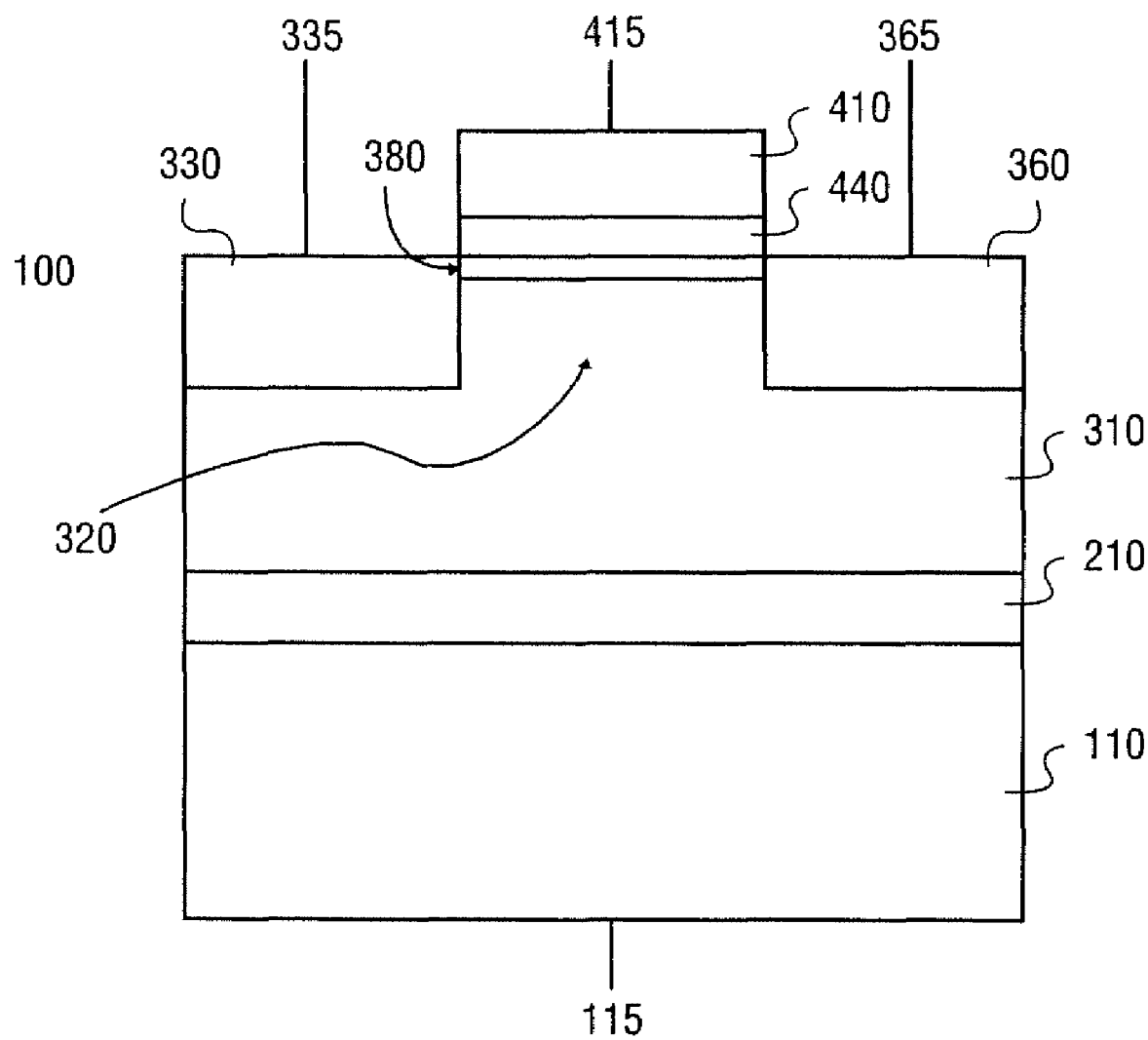
FIG. 3 is an illustration of a cross-sectional view of an embodiment of the structure of FIG. 2 with a gate formed thereon.

Devices may be formed on semiconductor layer 310. FIG. 3 is a cross-sectional illustration of an embodiment of the structure of FIG. 2, with gate 410 formed thereon. Gate 410 is separated from the surface of semiconductor layer 310 by gate dielectric 440. Gate terminal 415 is associated with gate 410. Semiconductor seed layer 310 includes well active region 320, source region 330 and drain region 360. Source region terminal 335 is associated with source region 330. Drain region terminal 365 is associated with drain region 360. Representatively, channel region 380 runs from source region 330 to drain region 360. Semiconductor substrate terminal 115 is associated with semiconductor substrate 110.

The materials used to form the various layers of an embodiment may be selected based on conduction band and/or valence band characteristics. In an embodiment, (a pMOS transistor formed in layer 310 on an insulator 210 is built upon an n type semiconductor substrate 110), if semiconductor layer 310, the insulator 210, and the semiconductor substrate 110, have conduction bands that are substantially aligned, while a large valence band barrier exist between the insulator 210 and semiconductor 310, or between the insulator 210 and the semiconductor substrate 110. The minority carriers in the well region 320 (holes, in this case) may be extracted through source region terminal 335 by applying a positive bias to the substrate contact 115 and grounding the source contact 335. Equal amount of electrons can flow through the substrate contact 115, since the conduction band edges across the semiconductor 310/insulator 210 and the insulator 210/semiconductor 110 interfaces are substantially aligned. At the mean time, the minority carrier in the substrate 110 can't flow into the well region of semiconductor 310, due to the large valence band barriers at the interfaces. By extracting minority carriers, the junction leakage will be reduced. For example, in an embodiment, a mechanism for extracting minority carriers can be established by forming an insulator layer 210 including barium titanate ($BaTiO_3$) on semiconductor substrate 110 including germanium (Ge). In this example, an electron affinity for the conduction band edge of barium titanate ($BaTiO_3$) is 4.15 eV and an electron affinity of the conduction band edge for germanium (Ge) is 4.18 eV. While the valence band edge of $BaTiO_3$ and Ge are located at 7.46 eV and 4.5 eV, respectively. The conduction band edges of these materials may be considered substantially aligned, and a very low conduction band barrier exists across insulator layer 210, while, at the same time, the valence band barrier is much higher (e.g., a difference of approximately 3 eV, given the respective values of 7.46 eV and 4.5 eV). The particular band edge alignment between $BaTiO_3$ and Ge allow the extraction of minority carriers of the Ge well region in semiconductor seed layer 310, when the device is properly biased. This example provides a representative selection of materials having substantially aligned conduction band edge, and should not be considered as limiting which materials may be considered substantially aligned, or which range of conduction band edge values may be considered substantially aligned. The minority carrier extraction can also be applied in a case where the valence band are substantially aligned and there is a large conduction band barrier across semiconductor seed layer 310 and insulator layer 210.

As discussed above, if semiconductor seed layer 310 and insulator layer 210 include materials with substantially aligned conduction band edges, minority carriers may be extracted through source region terminal 335. In this regard, whether the minority carriers are holes or electrons will depend on the type of the device. The biasing can be altered by applying various voltage bias and/or grounds to semiconductor substrate terminal 115, and the source region terminal 335.

In an embodiment, conduction band and/or valence band characteristics may facilitate the extraction of minority carriers, as discussed above.

Additionally, in an embodiment, a large valence barrier height is created between substrate 110 and insulator layer 210, or between the insulator 210 and semiconductor layer 310. This barrier reduces or prevents minority carriers from flowing from semiconductor substrate 110 through insulator layer 210 and into well-active region 320. The barrier is illustrated in an embodiment in which substrate 110 includes germanium (Ge) and insulator layer 210 includes barium titanate ($BaTiO_3$). The valence band edge value for barium titanate ($BaTiO_3$) is 7.46 eV, and the valence band edge value for germanium is 4.5 eV. This difference in valence band edge value may result in a large hole barrier height, which prevents minority carriers in substrate 110, e.g., holes, in this case, from flowing through insulator layer 210 and into semiconductor layer 310. Therefore, due to the relative conduction and valence band edge positions, carriers having a first type of charge may flow in one direction, but oppositely charged carriers are prevented from flowing in the opposite direction.

Figure 4:
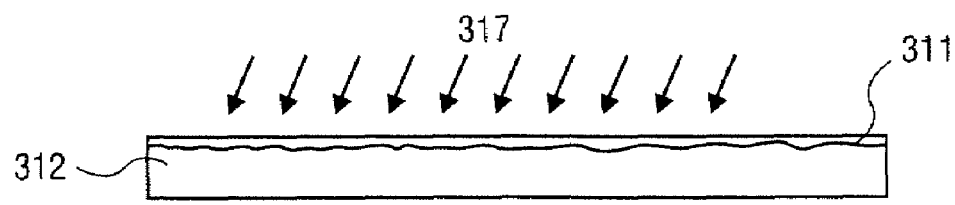
FIG. 4 is an illustration of a cross-sectional view of an embodiment of dopant being introduced into a seed semiconductor substrate.

Insulator layer 210 may also be used as a bonding interface for bonding semiconductor seed substrate 312 in an embodiment. In one embodiment, dopant is introduced into semiconductor seed substrate 312 prior to bonding. FIG. 4 shows dopant 317 introduced into semiconductor seed layer 312. Dopant 317 may be introduced by various methods, such as, for example, ion implantation, diffusion, or other methods. In one embodiment, ion implantation using species such as hydrogen (H) or oxygen (O) is employed. However, those skilled in the art will recognize that other implant species may be used. Likewise, those skilled in the art will recognize that other methods of introducing dopant that are practiced in the art will also be effective, and fall within the scope of the subject matter disclosed herein.

Figure 5:
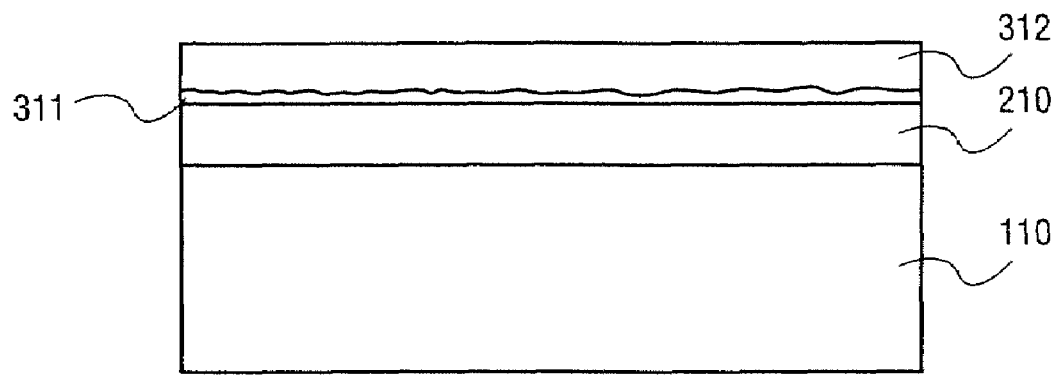
FIG. 5 is an illustration of a cross-sectional view of an embodiment of the structure of FIG. 1 with a seed semiconductor substrate bonded thereon.

FIG. 5 is a cross-sectional illustration of an embodiment of the implanted side of the semiconductor seed substrate 312 is bonded to a carrier substrate 110. Semiconductor seed substrate 312 can be bonded by a various processes, such as, for example, in one embodiment, by direct bonding through a hydrophilic bond at the interface. In this embodiment, hydrophilic surfaces such as an oxide layer 311, are required on at least one of the semiconductor seed substrate 312 or the carrier substrate bonding surface. In this embodiment, a deposited oxide layer 210, which include a epitaxially grown high dielectric constant insulator, on the carrier substrate is used as the hydrophilic surface for the wafer bonding.

Figure 6:
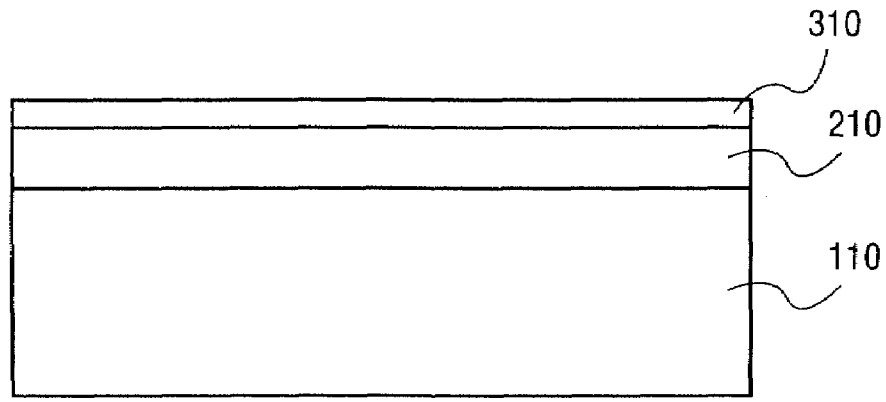
FIG. 6 is an illustration of a cross-sectional view of an embodiment of the structure of FIG. 5 following the removal of a portion of a seed semiconductor layer, leaving a semiconductor layer bonded to an insulator layer.

FIG. 6 is a cross-sectional illustration of an embodiment of the structure of FIG. 5 after a portion of semiconductor seed substrate 312 has been removed to form semiconductor layer 310, which remains bonded to insulator layer 210. A portion of semiconductor seed substrate 312 may be removed by various processes, such as, in one embodiment, thermal cleavage. Those skilled in the art will recognize that other processes, such as, for example, etch back, may also be employed to remove a portion of semiconductor seed layer 312. The type of process employed may depend on the type of implantation used. For example, for hydrogen (H) implantation, thermal cleavage is often used. For oxygen (O) implantation, etch back is often used.

In an embodiment, after a portion of semiconductor seed substrate 312 has been removed, the surface of the remaining portion of semiconductor seed substrate 312 may also undergo processes such as polishing, cleaning, rinsing and/or annealing to form semiconductor layer 310. Those skilled in the art will recognize that polishing, cleaning, rinsing and/or annealing, if performed, may be performed in various different manners and sequences, which may include all of these processes, may omit certain processes, and may also include other processes practiced in the art.

In an embodiment, for a PMOS arrangement, when a device is formed on top (as viewed) of the embodiment illustrated in FIG. 6, such embodiment may function similar to the embodiment illustrated in FIG. 3. That is, in one embodiment, matching conduction bands are formed across the interfaces between insulator layer 210, and semiconductor layer 310 and semiconductor substrate 110, where minority carriers can be extracted from well-active region 320 through the source contact (335). For NMOS arrangements, a matching valence band is formed, and facilitates the well region minority carrier (electrons, in this NMOS case) extraction. In this embodiment, for NMOS arrangements, a high conduction band barrier is formed across insulator layer 210 and substrate 110 and reduces or prevents minority carriers (electrons) from flowing from semiconductor substrate 110 through insulator layer 210 and into well-active region 320.

Figures 7, 8:
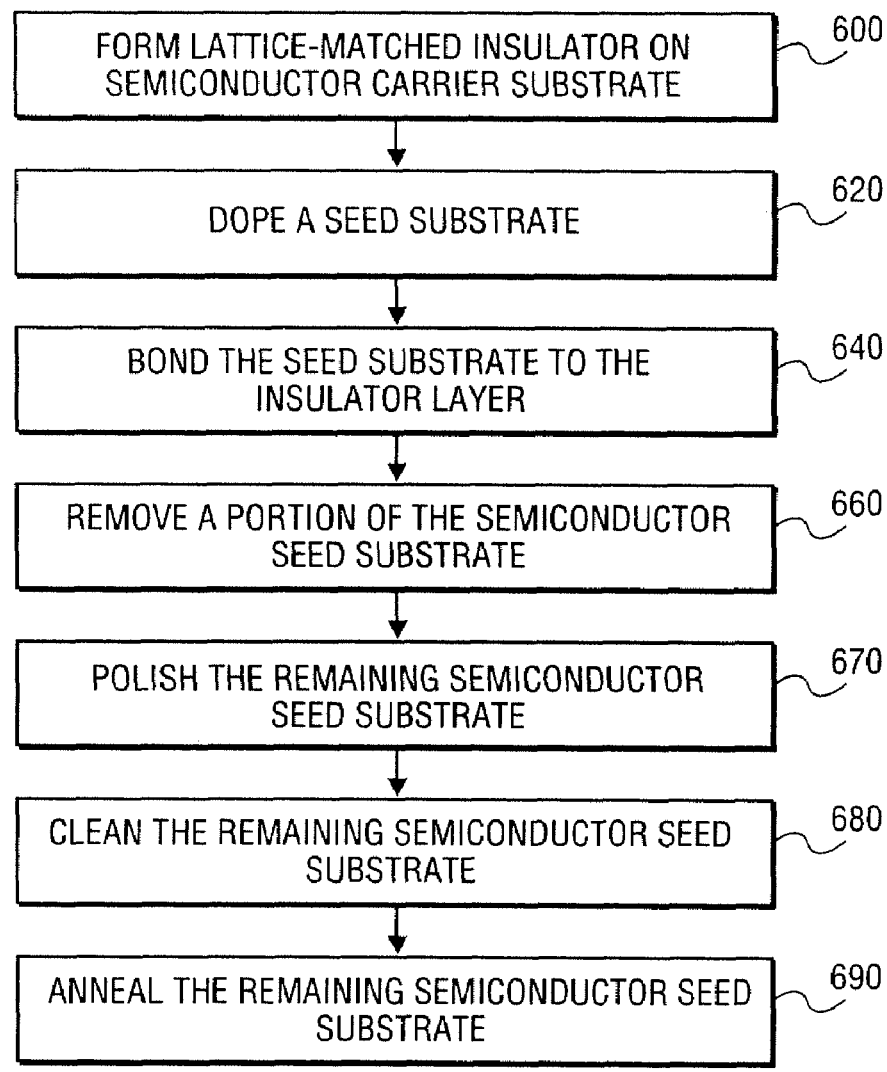
FIG. 7 is an illustration of a flow chart of an embodiment of a method to form an apparatus.
FIG. 8 is an illustration of a flow chart of an embodiment of a method to form an apparatus.

FIG. 7 is a flow chart illustrating an embodiment of a method to form an apparatus. At process block 500, an insulator layer is formed on a semiconductor substrate. The semiconductor substrate includes a portion that is lattice matched to a portion of the insulator layer. At process block 520, a semiconductor layer is formed on the insulator layer. In an embodiment, the semiconductor layer includes a portion that is lattice matched to a portion of the insulator layer.

FIG. 8 is a flow chart illustrating an embodiment of a method to form an apparatus. At process block 600, an insulator layer is formed on a semiconductor substrate. The semiconductor carrier substrate includes a portion that is lattice matched to a portion of insulator layer. At process block 620, a semiconductor seed substrate is doped. In an embodiment, at process block 640, the doped semiconductor seed substrate is bonded to the insulator layer. A portion of the semiconductor seed substrate is removed at process block 660, in an embodiment. Process blocks 670, 680 and 690 relate, respectively, to polishing, cleaning and annealing the portion of the seed semiconductor substrate remaining on the insulator layer, which may also be performed in an embodiment. Those skilled in the art will recognize that, if performed, polishing, cleaning, rinsing and/or annealing may be performed in various different manners and sequences, which may include all of these processes, may omit certain processes, and also may include other processes practiced in the art.

Figure 9:
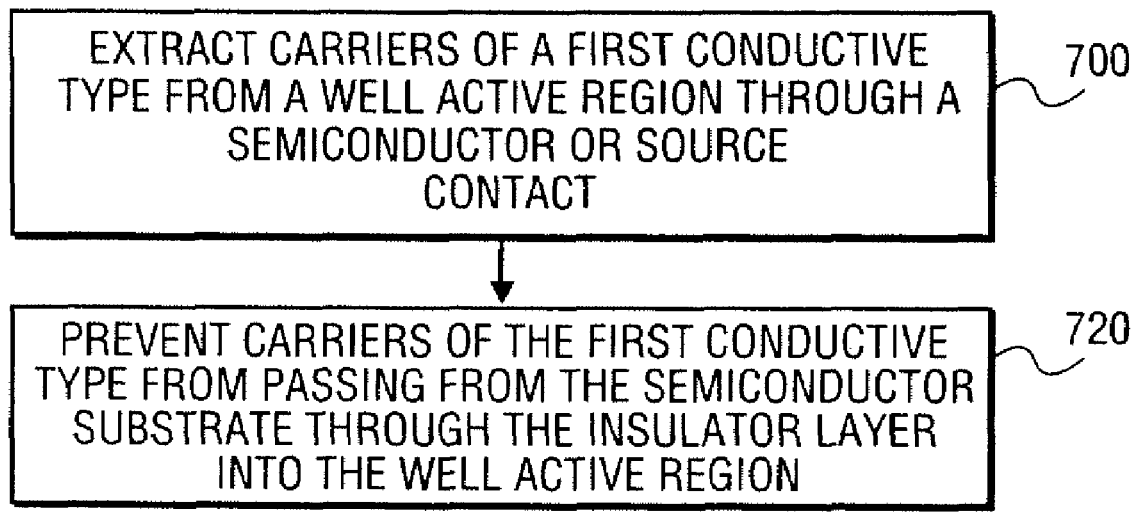
FIG. 9 is an illustration of a flow chart of an embodiment of a method to extract minority carriers.

FIG. 9 is a flow chart illustrating an embodiment of a method to reduce pn junction leakage in a high mobility semiconductor having high minority carrier concentration. In this method, at process block 700, minority carriers are extracted from a well active region through a source region terminal. Additionally, in an embodiment, at process block 720, carriers having the same conductive type are prevented from passing from the semiconductor substrate through the insulator layer into the well active region.

What is claimed is:

1. An apparatus comprising:
a semiconductor substrate comprising a first material; and
an insulator layer formed on the semiconductor substrate, wherein the insulator layer comprises a second material, the second material lattice-matched with the first material, wherein the semiconductor substrate comprises a crystalline surface, and wherein the insulator layer comprises an epitaxial insulator layer comprising one of crystalline varium titanate (BaTiO$_3$) and crystalline strontium titanate (SrTiO$_3$) in direct physical contact with the surface; and
wherein the surface consists of the first material, and were in the insulator layer comprises a different second material.

2. The apparatus of claim 1,
wherein the first material and the second material constitute a first material/second material pair selected from a group consisting of silicon (Si)/strontium titanate (SrTiO$_3$) and germanium (Ge)/barium titanate (BaTiO$_3$).

3. The apparatus of claim 1,
wherein a semiconductor layer is formed on the insulator layer, the semiconductor layer comprising one of the first material and a third material that is lattice matched with the second material.

4. The apparatus of claim 3,
wherein the second material and the one of the first material and a third material constitute a pair selected from a group consisting of strontium titanate (SrTiO$_3$)/silicon (Si) and barium titanate (BaTiO$_3$)/germanium (Ge).

5. The apparatus of claim 1, further comprising:
a plurality of semiconductor layers formed on the insulator layer,
wherein an intermediate insulator layer is formed between each semiconductor layer, and
wherein at least one of the intermediate insulator layers is lattice matched with at least one of the semiconductor layers adjacent to the at least one of the intermediate insulator layers.

6. The apparatus of claim 3,
wherein at least one device is formed on the semiconductor layer.

7. The apparatus of claim 3,
wherein the semiconductor layer is bonded to the insulator layer.

8. The apparatus of claim 7,
wherein a portion of the semiconductor layer is removed to reduce a thickness of the semiconductor layer.

9. The apparatus of claim 7,
wherein the semiconductor layer is doped.

10. An apparatus comprising:
a semiconductor substrate comprising a first material;
an insulator layer formed on the substrate, the insulator layer comprising a second material having a conduction band and a valence band, wherein the second material is lattice matched to the first material;
a semiconductor layer formed on the insulator layer, the semiconductor layer comprising one of the first material and a third material lattice matched to the second material, the one of the first material and a third material lattice matched to the second material having a conduction band and a valence band;
wherein one of the conduction band and the valence band of the second material is substantially aligned with the same band of the one of the first material and a third material lattice matched to the second material, wherein the semiconductor substrate comprises a crystalline surface, and wherein the insulator layer comprises an epitaxial insulator layer comprising one of crystalline varium titanate (BaTiO$_3$) and crystalline strontium titanate (SrTiO$_3$) in direct physical contact with the surface; and
wherein the surface consists of the first material, and were in the insulator layer comprises a different second material.

11. The apparatus of claim 10,
wherein the first material has a conduction band and a valence band, one of the conduction band and the valence band of the first material being substantially aligned with a same band of the second material.

12. The apparatus of claim 11, wherein the other of the valence band and conduction band of the first material is not substantially aligned with a same band of the second material.

13. The apparatus of claim 10, wherein the first material is germanium (Ge) and the second material is barium titanate ($BaTiO_3$).

14. The apparatus of claim 10, wherein the second material is barium titanate ($BaTiO_3$) and the one of the first material and a third material is germanium (Ge).

15. The apparatus of claim 10, further comprising:
a plurality of semiconductor layers formed on the insulator layer,
wherein an intermediate insulator layer is formed between each semiconductor layer, and
wherein at least one of the intermediate insulator layers is lattice matched with at least one of the semiconductor layers adjacent to the at least one of the intermediate insulator layers.

16. The apparatus of claim 10, wherein the semiconductor layer is bonded to the insulator layer.

17. The apparatus of claim 16, wherein a portion of the semiconductor layer is removed to reduce a thickness of the semiconductor layer.

18. The apparatus of claim 10, further comprising:
a second insulator layer formed on the semiconductor layer; and
a gate formed on the second insulator layer, the gate comprising a contact,
wherein the semiconductor substrate is doped and comprises a contact, wherein the doped semiconductor substrate is of a first conductive type,
wherein the semiconductor layer is doped and comprises a source region of the second conductive type, a drain region of the second conductive type, and a well active region of the first conduction type, the source region comprising a contact and the drain region comprising a contact, wherein a portion of the well active region between the source region and the drain region defines a channel region extending from the source region to the drain region,
wherein the doped substrate is biased such that when during device operation, minority carriers in the well region will flow through the source region to the source region contact.

19. The apparatus of claim 18, wherein the level of minority carrier concentration in the doped semiconductor substrate is greater than the level of minority carrier concentration in the semiconductor layer due to the minority carrier extraction from the well region of the semiconductor layer.

20. The apparatus of claim 18, wherein the insulator layer has a thickness establishing one of a valence barrier height and conduction barrier height sufficient to prevent minority carriers in the substrate from flowing through the insulator layer, and into the well active region in the semiconductor layer.

21. An apparatus comprising:
a semiconductor substrate comprising a first material;
an insulator layer formed on the substrate, the insulator layer comprising a second material having a conduction band and a valence band, wherein the second material is lattice matched to the first material;
a semiconductor layer formed on the insulator layer, the semiconductor layer comprising one of the first material and a third material lattice matched to the second material, the one of the first material and a third material lattice matched to the second material having a conduction band and a valence band;
wherein one of the conduction band and the valence band of the second material is substantially aligned with the same band of the one of the first material and a third material lattice matched to the second material,
wherein the semiconductor substrate is doped and comprises a contact, wherein the doped semiconductor substrate is of a first conductive type;
wherein the semiconductor layer is doped and comprises a source region of the second conductive type, a drain region of the second conductive type, and a well active region of the first conduction type, the source region comprising a contact and the drain region comprising a contact;
wherein the doped substrate is biased such that when during device operation, minority carriers in the well region will flow through the source region to the source region contact.

* * * * *